(12) United States Patent
Sun et al.

(10) Patent No.: US 8,184,668 B2
(45) Date of Patent: May 22, 2012

(54) METHOD FOR REDUCING CAPACITANCE AND IMPROVING HIGH FREQUENCY PERFORMANCE IN VERTICAL CAVITY SURFACE EMITTING LASERS (VCSELS)

(75) Inventors: Decai Sun, Los Altos, CA (US); Phil Floyd, Sunnyvale, CA (US); Wenjun Fan, Albuquerque, NM (US)

(73) Assignee: Neophotonics Corporation, San Jose, CA (US)

( * ) Notice: Subject to any disclaimer, the term of this patent is extended or adjusted under 35 U.S.C. 154(b) by 0 days.

(21) Appl. No.: 12/985,487

(22) Filed: Jan. 6, 2011

(65) Prior Publication Data

US 2011/0096801 A1 Apr. 28, 2011

Related U.S. Application Data

(62) Division of application No. 10/936,218, filed on Sep. 7, 2004, now Pat. No. 7,903,712.

(60) Provisional application No. 60/500,728, filed on Sep. 4, 2003.

(51) Int. Cl.
*H01S 3/10* (2006.01)

(52) U.S. Cl. ............ 372/20; 372/46.014; 372/46.015; 372/50.1; 372/50.124

(58) Field of Classification Search ............ 372/20, 372/46.014, 46.015, 50.1
See application file for complete search history.

(56) References Cited

U.S. PATENT DOCUMENTS

| | | | |
|---|---|---|---|
| 5,629,951 A * | 5/1997 | Chang-Hasnain et al. | 372/20 |
| 6,852,557 B1 * | 2/2005 | Shieh | 438/31 |
| 2001/0017876 A1 | 8/2001 | Kner et al. | |
| 2002/0131458 A1 | 9/2002 | Sirbu et al. | |
| 2003/0039284 A1 | 2/2003 | Zheng | |
| 2004/0101009 A1 | 5/2004 | Johnson et al. | |

OTHER PUBLICATIONS

U.S. Office Action for U.S. Appl. No. 10/936,218 mailed on Jun. 16, 2010.

* cited by examiner

*Primary Examiner* — Dung Nguyen
(74) *Attorney, Agent, or Firm* — Turocy & Watson, LLP

(57) ABSTRACT

A VCSEL structure is provided. The VCSEL structure comprises a substrate. The structure may also include one or more conducting layers positioned on the substrate. There may be void spaces positioned between portions of the conducting layers to electrically isolate the portions. A method for fabricating the VCSEL structure is also provided.

19 Claims, 4 Drawing Sheets

METHOD FOR REDUCING CAPACITANCE AND IMPROVING HIGH FREQUENCY PERFORMANCE IN VERTICAL CAVITY SURFACE EMITTING LASERS (VCSELS)

CROSS-REFERENCE TO RELATED APPLICATIONS

This application is a Division of application Ser. No. 10/936,218 filed Sep. 7, 2004, which is based upon and claims the benefit of claims the benefit of U.S. Provisional Ser. No. 60/500,728, filed Sep. 4, 2004, the entire contents of both of which are hereby incorporated herein by reference.

FIELD OF THE INVENTION

The present invention relates generally to semiconductor lasers, and more particularly to temperature increase of tunable Vertical Cavity Surface Emitting Lasers (VCSELs). The invention describes an approach developed to reduce the device temperature and consequently improve its performance.

DESCRIPTION OF RELATED ART

Optical communication systems are a substantial and fast growing constituent of communications networks. Such optical systems include, but are not limited to, telecommunication systems, cable television systems, and Local Area Networks (LANs). Optical systems are described in Gowar, Ed. Optical Communication Systems, (Prentice Hall, N.Y.) c. 1993, the disclosure of which is incorporated herein by reference. Currently, the majority of optical systems are configured to carry an optical channel of a single wavelength over one or more optical wave-guides. To convey the information form plural sources, time division multiplexing is frequently employed (TDM). In time division multiplexing, a particular time slot is assigned to each information source, the complete signal being constructed from the signal collected from each time slot. While this is a useful technique for carrying plural information sources on as single channel, its capacity is limited by fiber dispersion and the need to generate high peak power pulses.

While the need for communication systems increases, the current capacity of existing wave-guiding media is limited. Although capacity may be expanded, e.g. by laying more fiber optic cables, the cost of such expansion is prohibitive. Consequently, there exists a need for a cost-effective way to increase the capacity of the existing optical wave-guides.

Wavelength division multiplexing (WDM) and dense wavelength division multiplexing (DWDM) have been explored as approaches for increasing the capacity of the existing fiber optic networks. Such system employs plural optical signal channels, each channel being assigned a particular channel wavelength. In a typical system, optical signal channels are generated, multiplexed to form an optical signal comprised of the individual optical signal channels, transmitted over a single wave-guide, and de-multiplexed such that each channel wavelength is individually routed to a designated receiver. Through the use of optical amplifiers, such as doped fiber amplifiers, plural optical channels are directly amplified simultaneously, facilitating the use of WDM and DWDM approaches in long distance optical systems.

Crucial to providing sufficient bandwidth for WDM and DWDM, while at the same time avoiding bottlenecks, is the ability to assign and re-assign wavelengths as needed throughout the network and providing the bandwidth when and where needed. Allowing more flexibility in the way fiber capacity is provisioned is the driving force behind the requirements of next generation optical networks. Future network capacity needs will probably require a multi fold scalability beyond a network's initial installed capacity and also a rapid service activation to allow high capacity links to be deployed as needed.

Tunable lasers that can be tuned over a wide range of wavelengths and switched at nanosecond speeds best meet such requirements. A number of schemes have been proposed and studied to obtain frequency tuning of semiconductor lasers. These methods have typically relied on tuning the index of refraction of the optical cavity. The resulting tunable range is, however, restricted to approximately 10 nm.

In addition, the bulk of the tuning schemes have been attempted with edge emitting laser structures. Unlike vertical cavity surface emitting lasers (VCSEL), these structures are not single mode and consequently the use of distributed Bragg reflectors or distributed feedback, both of which are difficult to fabricate, are required to select a single mode.

Interferometric techniques that rely on variable selection of different Fabry-Perot modes for tuning from a comb of modes have also been proposed. Among these are asymmetric y-branch couplers and vertical cavity filters. These methods produce tuning ranges of up to 100 nm, but are, however, restricted to discrete tuning only and are potentially unstable between the tuning steps.

Most of the above mentioned techniques are polarization sensitive and therefore cannot be readily adopted to optical communications systems, which need to be robust and inexpensive and consequently insensitive to beam polarization.

A critical and costly problem in all WDM and DWDM is created by the need for exact wavelength registration between transmitters and receivers. A tunable receiver capable of locking to the incoming signal over a range of wavelengths variation would relax the extremely stringent wavelength registration problem. The tunability requirement can best be met by proper VCSEL utilization. VCSELs possess desirable qualities for telecommunications: circular mode profile that makes them ideally suited for coupling into optical fibers, single mode operation, surface mode operation and compact size. Complete description of the VCSEL device and its operation can be found in the U.S. issued U.S. Pat. Nos. 5,629,951 and 5,771,253 both of which are incorporated herein by reference.

VCSEL of this invention is a cantilever apparatus based on the principle of an electrostatic force pulling on a simple cantilever arm. The device so formed is capable of continuously tuning the resonant frequency of the Fabry-Perot cavity over a wide range of wavelengths. The resonant cavity is formed between two distributed Bragg reflector (DBR) mirrors. The top reflector is composed of a movable top DBR supported in a cantilever arm, a variable thickness air spacer layer and a fixed DBR. The bottom reflector is fixed in the substrate. By applying a tuning voltage to create electrostatic attraction, the cantilever arm may be deformed towards the substrate, thereby changing the thickness of the air spacer layer and consequently the resonant wavelength of the Fabry-Perot cavity. A precise control of substrate to cantilever arm distance is necessary in order to maintain the desired wavelength and meet the wavelength stability requirements.

One of the important advantages of semiconductor lasers is that they can be directly modulated, i.e. one can readily obtain short optical pulses useful for optical communications by modulating the laser current. This is typically accomplished by placing a small amplitude modulated alternating current signal onto a direct current signal. Typical laser frequency response (transfer function) showing the output power as a function of frequency is shown in FIG. 1. The power peak is observed at the laser's resonant frequency. The output power is strongly affected by the laser parasitic capacitance's. The adverse effect of the increasing parasitic capacitance on the output power is shown in FIG. 2. At higher operating frequencies this effect becomes even more pronounced. In a typical VCSEL, the primary contributors to the parasitic capacitance are the tuning pad, laser head and the bonding pad. Semiconductor laser manufacturers have resorted to creative but costly approaches to reduce the effects of parasitic capacitance. Most typically, a deep proton implants are utilized to electrically isolate the regions contributing to the capacitance. The deep implant is intended to isolate the laser head from the tuning pad. The shallow implant defines the aperture around the laser head. Since the layers that require implant are several microns thick and the background concentration that needs to be overcome for the isolation to be effective is of the order of 10exp18, a high energy and a high dose proton implants are mandatory. Typically, a deep implant requires energies of the order of 1 mega electron volts (MeV). In spite of high proton beam energies, due to normal process variations, the process may not succeed in completely isolating the implanted areas, i.e., some portion of the background doping of semiconducting layers may not be neutralized and a current path may exist between the areas intended to be isolated from each other. Moreover, inherent to the implant process is an additional photolithography process step requiring a photoresist layer to protect the areas of the device not to be implanted. The photoresist thickness needs to be approximately 25 micrometers (um). As a result of high proton beam energy and the time required to complete the deep implant process, the photoresist layer is exposed to very high temperature for long periods of time that cause it to polymerize and change to a very hardened state. Numerous dry and wet photoresist stripping steps need to be implemented to successfully remove the photoresist after an implant step.

Additionally, the deep implant has several drawbacks. It causes substantial damage to the implanted areas of the device that cannot be annealed out in this application since the anneal process would electrically activate the implanted region and defeat the main purpose of the implant process. The high energy of a deep implant also damages the cantilever and makes it more droop prone. The cantilever droop would causes a shift in the device resonant wavelength and a possible failure of communications equipment the laser is installed in. Furthermore, the process cycle time due to the implant and the subsequent photoresist stripping step is substantially increased as several process steps are added and the cost of an implant run is of the order of several thousand dollars. The device reliability due to the damage to cantilever and other areas of the device may also be compromised.

Due to the deficiencies of the existing technologies described here there is a need for an improved process that meets electrical isolation requirements and avoids costly photolithography and implant process steps. The invention disclosed herein meets such requirements.

SUMMARY OF THE INVENTION

This invention is directed to an etch process that removes the semiconducting layers that would normally be implanted through. An etch tunnel is created in single or multiple locations by a combination of well known dry and wet etch processes. The etch tunnels physically and electrically isolate the device active area from the sources of parasitic capacitance. An electrical test measuring the current between the areas separated by etch is performed to assure that all the material has been removed. An additional capacitance measurement may be performed to confirm the results of the current measurement. Therefore, the laser head is fully electrically isolated from the tuning pad and the bonding pad and their respective contributions to the device capacitance are removed.

OBJECTS AND ADVANTAGES OF THE INVENTION

It is an object of the present invention to provide an apparatus for tuning the resonance wavelength of a Fabry-Perot cavity in a continuous manner over a wide range of wavelengths.

It is a further object of the present invention to provide a vertical cavity apparatus with cantilever arm for tuning the resonance wavelength of a Fabry-Perot cavity in a continuous manner over a wide range of wavelengths.

Another object of the present invention is to ensure that the laser head of the apparatus has been electrically isolated from the laser tuning pad.

Another object of the present invention is to ensure that the laser head of the apparatus has been electrically isolated from the laser drive pad.

It is a further object of the present invention to ensure that a dry etch process is employed to achieve electrical isolation.

Another object of the present invention is to ensure that a wet etch process is employed to achieve electrical isolation.

Yet another object of the present invention is to ensure that a dry etch and a wet etch are both employed to achieve electrical isolation.

It is a further object of the present invention that the apparatus is polarization insensitive.

It is another object of the present invention to ensure that the apparatus be simple in construction, easy to control and straightforward to manufacture. These and other objects and advantages of the present invention will become more apparent after considering of the ensuing description and the accompanying drawings.

DETAILED DESCRIPTION OF THE INVENTION

Figure 1:
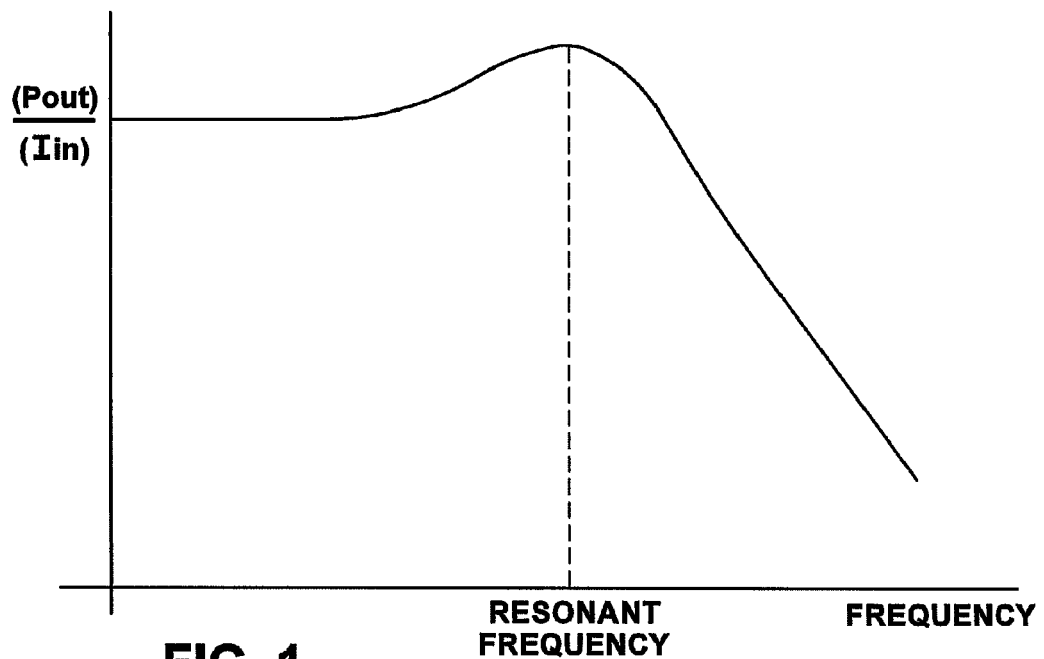
FIG. 1 shows a typical laser output power v. frequency behavior.
Figure 2:
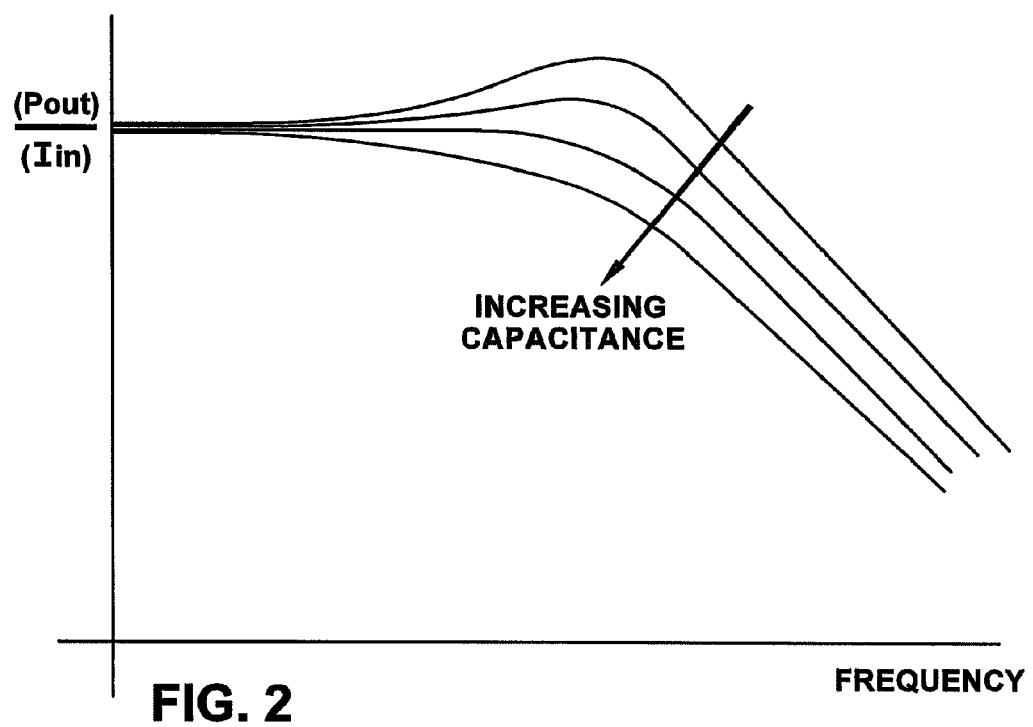
FIG. 2 shows the effect of increased capacitance on output power.
Figure 3:
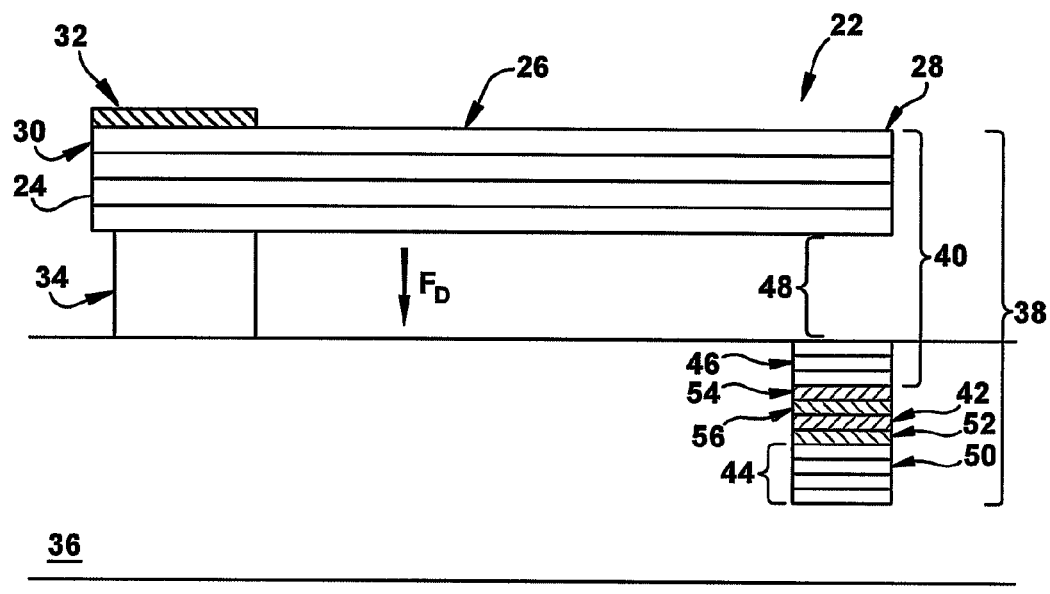
FIG. 3 is a side view of the existing vertical cavity cantilever apparatus
Figure 4:
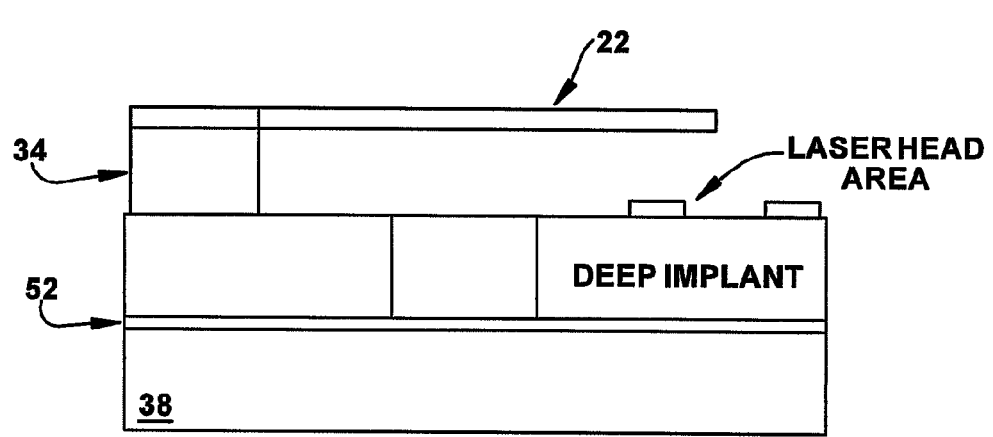
FIG. 4 shows the vertical cavity cantilever apparatus with deep implant isolating the tuning pad from the laser head

In the most basic embodiment, a cantilever arm apparatus according to the invention makes use of an electrostatic force pulling on a simple cantilever arm. The mechanical deflection resulting from this force can be used to change the length of the Fabry-Perot microcavity and consequently to tune the resonant wavelength. FIG. 3 shows a side view of simple embodiment of such an apparatus. If desired the device can also be operated at the fixed wavelength.

In particular, a cantilever arm apparatus 20 has a cantilever structure 22 consisting of a base 24, a cantilever arm 26, and active head 28. In the embodiment shown, the bulk of cantilever arm structure 22 consists of four reflective layers 30, which form a distributed Bragg reflector (DBR). It is preferable to make layers 30 of AlGaAs. Different compositional ratios are used for individual layers 30, e.g., Al(0.09)Ga(0.91) As/Al(0.58)Ga(0.42)As. The topmost layer 30 is heavily doped to ensure good contact with an electrical tuning contact 32 deposited on top of cantilever structure 22. The actual number of layers 30 varies from 1-20 depending on the desired reflectivity of DBR 30. Furthermore, any suitable reflective material other than AlGaAs may be used to produce the reflective layers 30. A person skilled in the art will be able to choose the right materials and dimensional parameters for the reflective layers 30. Finally, it is not even necessary that the cantilever arm 26 or the base 24 be made of reflective layers as long as the active head 28 includes the reflective layers 30.

In the embodiment shown, base 24 is rectangular and suitably large to ensure dimensional stability of the cantilever structure 22. The width of the cantilever arm 26 ranges typically from 5 to 10 microns while the length is 100 to 500 microns or more. The cantilever arm stiffness increases as the length decreases. Consequently, a shorter cantilever arm requires greater forces to deform but the shorter cantilever arm also resonates at a higher frequency. The preferred diameter of the active head 28 falls between 10 and 40 microns. Of course, the other dimensions are also possible and a person skilled in the art will be able to compute them according to the requirements at hand.

Electrical tuning contact 32 may reside on top of cantilever arm structure 22 or may be suitably placed elsewhere on the device. In this embodiment, electrical tuning contact 32 is made of gold. However, any other electrically conducting material can be used. The only limitation is that the electrical tuning contact 32 be sufficiently large to allow application of the first tuning voltage V(t1) as discussed below.

Base 24 rests on a support block 34 across which a voltage can be sustained. In this case, block 34 is composed of GaAs or InP. Block 34 sits on an electrically responsive substrate 36, preferably made of suitably doped GaAs or InP. A voltage difference between layers 30 and substrate 36 causes a deflection of arm 26 towards substrate 36. If layers 30 and substrate 36 are opposite doped, then a reverse bias voltage can be established between them. Substrate 36 is sufficiently thick to provide mechanical stability to entire cantilever arm apparatus 20. Inside substrate 36 and directly under active head 28 are lodged one or more sets of reflective layers 30 forming a second DBR.

A Fabry-Perot cavity 38 is formed by a top reflector 40, an active region or medium 52, a conventional cavity spacer layer 42, and a bottom reflector 44. Top reflector 40 is formed by DBR layers 30, an air gap 48, which acts as a DBR layer, and a second set of reflective layers 46 in the substrate 36. In other words, top reflector 40 is composed of two semiconductor portions sandwiching tunable air gap 48. The first semiconductor portion is contained in active head 28 in the layers 32. The second semiconductor portion, consisting of layers 46, is lodged inside substrate 36.

Bottom reflector 44 is composed of four reflecting layers 50. Just as in the case of layers 30, the number of layers 50 will depend on the desired reflectivity of bottom reflector 44. If, as in a filter, no active region or spacer layer is required, the top reflector may be composed of only top DBR layers 30. In this case, air gap 48 may itself form the spacer layer, and the bottom reflector is formed by layers 50.

In a Fabry-Perot cavity such as cavity 38, the total number of layers similar to layers 44 can vary from none to several tens. If no active layer is needed, tunable air gap 48 can itself form the spacer layer and the top reflector can be entirely formed from layers 30 lodged in active head 28. However, where an active layer is required, such as in laser or in detector, tunable air gap 48 and the cavity spacer layer such as layer 42 may be distinct and independent. In this case, at least one layer 46 is required. The actual number of layers 46 depends on the number of layers 30, the desired reflectivity, the desired tuning range, and other well-known optical parameters of the apparatus. However, in any bridge arm apparatus similar to apparatus 20, active head 28 has to contain at least one layer 30. The size of the active head 28 can be tailored to suit the specific device requirements. Additionally, a current confinement layer 54 may be employed in laser applications. The layer 54 is comprised of group III-V material and another readily oxidizable element, preferably aluminum, or the layer 54 function may be accomplished by an ion implantation or similar process. If needed the heat spreader layer 56 may be utilized to reduce the heat accumulation in the device. The layer 56 is comprised of group III-V materials, such as GaAs, InP or similar.

The remaining part of Fabry-Perot cavity 38 consists of a conventional cavity spacer 42, active medium 52, and four reflecting layers 50. The latter constitute bottom reflector 44. Just as in the case of layers 30 and 46, the number of layers 50 will vary depending on the desired reflectivity of bottom reflector 44.

Figure 5:
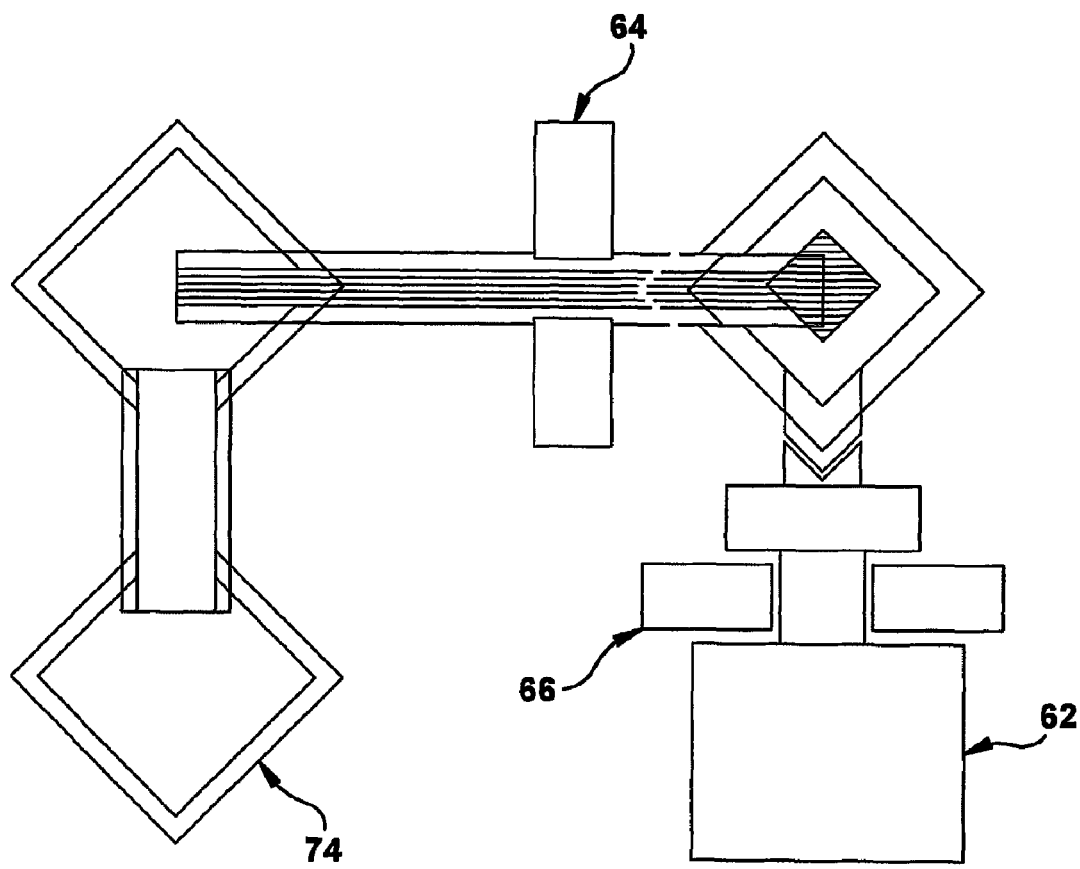
FIG. 5 is a top view of the device of this invention showing the etched areas.
Figure 6:
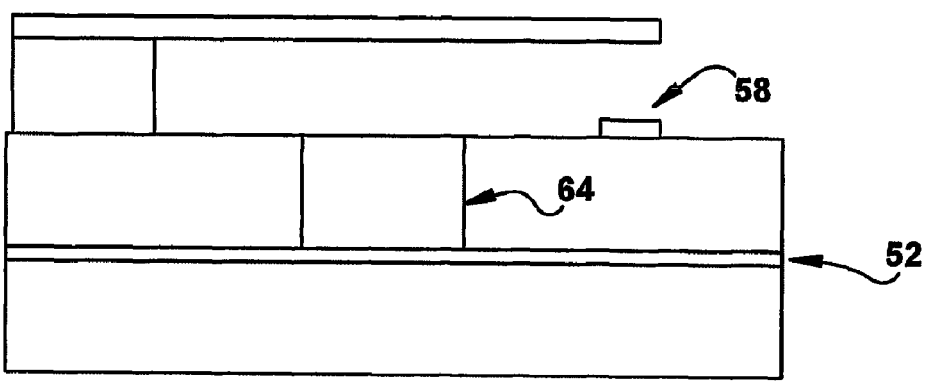
FIG. 6 is a cross-sectional view of the device of this invention showing the etched area isolating the laser head from the tuning pad.
Figure 7:
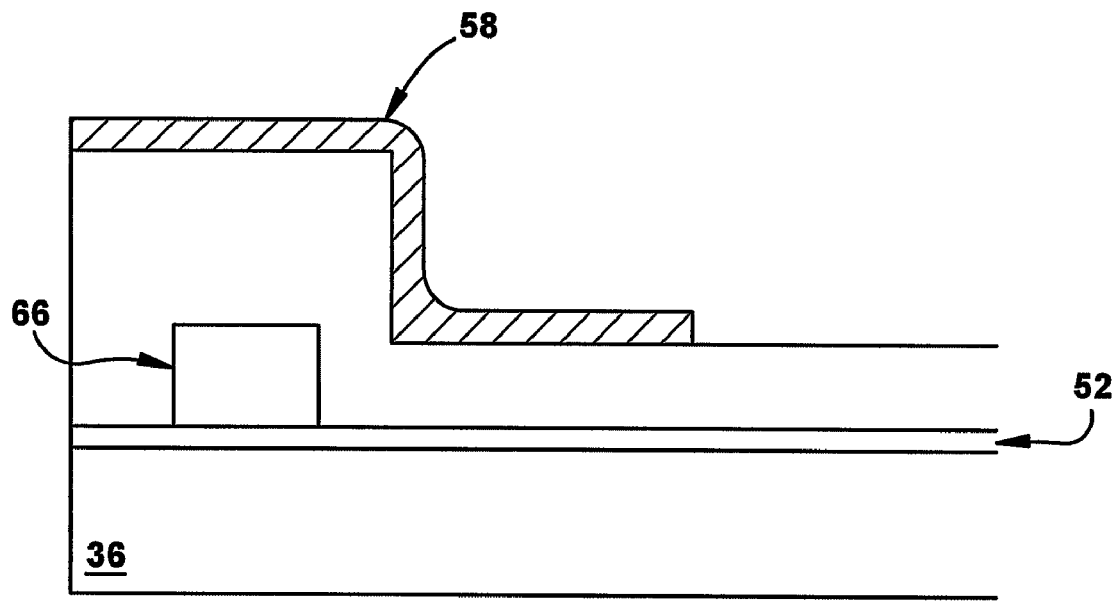
FIG. 7 is a cross-sectional view of the device of this invention showing the etched area isolating the laser head from the bonding pad.
Figure 8:
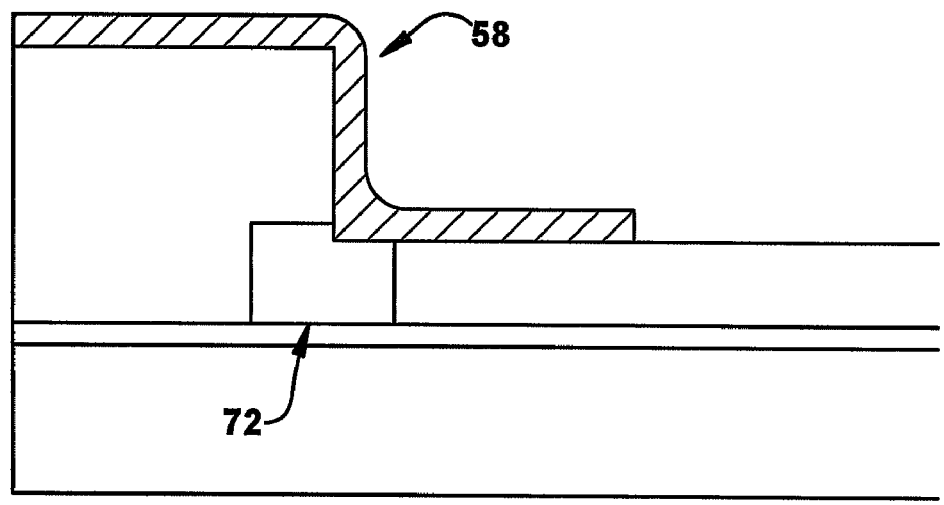
FIG. 8 is cross-sectional view of an alternative etch approach to isolating the laser head from the bonding pad.

The electrical isolation of the device of this invention is achieved by etching the tunnels 64 and 66. The etch tunnel 64, shown in FIGS. 5 and 6, isolates the laser head 58 from the tuning pad 74 and eliminates any tuning pad 74 capacitance contribution. The etch tunnel 64 extends through the reflective layers 46, spacer layer 42, current confinement layer 54 and heat spreader layer 56. Additional layers may be etched if desired. The etch tunnel 66 isolates the laser head 58 from the laser drive pad 62. The etch tunnel 66 extends through the same layers as the etch tunnel 64. FIG. 7 is a cross-sectional view showing the etch tunnel 66 that isolates the laser head 58 from the bonding pad 62. Another embodiment of isolating the laser head from the laser drive pad is shown in FIG. 8 with the etch tunnel 72. A person skilled in the art will easily determine proper etch formulations for the types of materials included in the layers to be etched. Both, dry etch and wet etch processes may be employed as a combination or individually. The etch methods described can be used to similarly reduce parasitic capacitance due to any other source on any other device.

As indicated in FIG. 3, the height of block 34 is typically 2.5 micrometers; thus the cantilever arm structure 22 is situated distance D=2.5 micrometers above substrate 36. Of course, block 34 can be placed significantly higher or lower, depending on the desired tuning range.

The operation of the cantilever arm apparatus 20 is best visualized in FIG. 3 To tune the Fabry-Perot cavity 38 a first tuning voltage Vt1 is applied to a tuning contact 32. The application of Vt1 results in charge accumulation on contact 32 and the bridge structure 22. The charge on contact 32 and structure 22 causes an equal and opposite charge to accumulate at the surface of electrically responsive substrate 36. The attracting charges produce a vertical force Fd acting on the bridge arm 26 and the active head 28. Vertical force Fd causes the bridge arm 26 to deform and distance D to decrease.

As distance D decreases so does the effective length of Fabry-Perot cavity 38. A change in the cavity length alters the resonance wavelength of the cavity. Thus, decreasing distance D results in decease in the resonance wavelength of the Fabry-Perot micro cavity. Furthermore since distance D is a continuous function of tuning voltage Vt1, and since Vt1 can be adjusted continuously, the tuning of the wavelength is continuous. Because active head 28 is nearly circularly symmetric, the bridge arm apparatus 20 is polarization-insensitive and thus well suited for applications in optical communications systems. Apparatus 20 is also simple in construction, easy to control and all layers may be grown in one processing step.

Although the present invention has been described in considerable detail, other variations are possible. Therefore, the spirit and the scope of the claims should not be limited to the description of the version contained herein.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A vertical cavity surface emitting laser (VCSEL) apparatus, comprising:
   a substrate comprising one or more etch tunnels that electrically isolate at least a portion of the substrate;
   a cantilever arm mounted on the substrate;
   a tuning pad for controlling an electrostatic force applied to the cantilever arm or the substrate to control a resonant wavelength of the VCSEL, the etch tunnels electrically isolate the tuning pad from the substrate and a semiconductor laser head positioned on the substrate; and
   a resonant cavity comprising a top reflector and a bottom reflector, wherein the bottom reflector is fixed in the substrate.

2. The apparatus of claim 1, the top reflector comprises a first distributed Bragg reflector (DBR) supported by the cantilever arm, an air spacer layer, and a second DBR fixed in the substrate.

3. The apparatus of claim 1, the resonant cavity further comprises an active layer.

4. The apparatus of claim 1, the resonant cavity further comprises a cavity spacer layer.

5. The apparatus of claim 1, the resonant cavity further comprises a current confinement layer.

6. The apparatus of claim 1, the resonant cavity further comprises a heat spreader layer.

7. The apparatus of claim 1, the bottom reflector comprises one or more distributed Bragg reflector layers.

8. The apparatus of claim 1, a voltage difference between the substrate and cantilever arm is adjustable to tune a deflection of the cantilever arm.

9. The apparatus of claim 1, the width of the cantilever arm is about 5 microns or more.

10. The structure of claim 1, further comprising a Fabry-Perot cavity, wherein a resonant frequency of the Fabry-Perot cavity is continuously tunable.

11. The structure of claim 2, at least one of the one or more DBR layers comprises AlGaAs.

12. The structure of claim 1, the length of the cantilever arm apparatus is at least about 100 microns.

13. The structure of claim 1, further comprising a heat spreader layer that reduces the heat accumulation in the VCSEL structure.

14. The structure of claim 13, the heat spreader layer comprises one or more group III-V materials.

15. A vertical cavity surface emitting laser (VCSEL) apparatus, comprising:
    a substrate comprising one or more etch tunnels that electrically isolate at least a portion of the substrate;
    a cantilever arm mounted on the substrate by a connecting block;
    a tuning pad for controlling an electrostatic force applied to the cantilever arm apparatus or to the substrate to control a resonant wavelength of the VCSEL the etch tunnels electrically isolate the tuning pad from the substrate;
    a void space positioned between at least the substrate and the tuning pad; and
    a resonant cavity comprising a top reflector and a bottom reflector, wherein the bottom reflector is fixed in the substrate.

16. The apparatus of claim 15, the width of the cantilever arm is about 5 microns or more and the length of the cantilever arm apparatus is at least about 100 microns.

17. The apparatus of claim 15, the top reflector comprises a first distributed Bragg reflector (DBR) supported by the cantilever arm, an air spacer layer, and a second DBR fixed in the substrate.

18. The apparatus of claim 15, the resonant cavity further comprises a cavity spacer layer and a current confinement layer.

19. A method for decreasing parasitic capacitance of a vertical cavity surface emitting laser (VCSEL) comprising:
    forming a conducting layer on a III-V material substrate; and
    controlling an electrostatic force applied to a cantilever arm using a tuning pad that controls a resonant wavelength of the VCSEL
    etching spaces at predetermined locations in said conducting layer to electrically isolate a portion of said layer, the etching spaces includes forming a void and electrically isolating the substrate from the tuning pad.

* * * * *